(12) United States Patent  (10) Patent No.: US 7,990,192 B2
Sun  (45) Date of Patent: Aug. 2, 2011

(54) PHASE LOCKED LOOP AND METHOD FOR CHARGING PHASE LOCKED LOOP

(75) Inventor: Hongquan Sun, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 12/690,466

(22) Filed: Jan. 20, 2010

(65) Prior Publication Data

US 2010/0259306 A1 Oct. 14, 2010

(30) Foreign Application Priority Data

Apr. 9, 2009 (CN) .......................... 2009 1 0081492

(51) Int. Cl.
*H03L 7/06* (2006.01)
(52) U.S. Cl. ........................................ 327/157; 327/148
(58) Field of Classification Search ........................ None
See application file for complete search history.

(56) References Cited

U.S. PATENT DOCUMENTS

| 5,874,863 A * | 2/1999 | Wojewoda et al. ............. 331/17 |
| 5,942,926 A | 8/1999 | Yamaguchi | |
| 6,914,489 B2 * | 7/2005 | Charlon ........................... 331/16 |
| 7,746,132 B2 * | 6/2010 | Okamoto et al. ............. 327/156 |
| 2003/0006848 A1 * | 1/2003 | Cordoba ......................... 331/17 |

FOREIGN PATENT DOCUMENTS

CN 1162219 A 10/1997

OTHER PUBLICATIONS

1st Office Action in corresponding Chinese Application No. 200910081492.0 (Feb. 1, 2011).

* cited by examiner

*Primary Examiner* — Cassandra Cox
(74) *Attorney, Agent, or Firm* — Leydig, Voit & Mayer, Ltd.

(57) ABSTRACT

A phase locked loop (PLL) and a method for charging the PLL are disclosed. The charge circuit includes: a threshold judging module, adapted to output a signal to a receiving module, and when the voltage of a filter reaches a preset threshold, output a valid signal to the receiving module; the receiving module, adapted to receive a trigger signal and output a first control signal to a charging module, and when the signal from the threshold judging module is a valid signal, adapted to output a second control signal to the charging module; the charging module, adapted to charge the filter when receiving the first control signal and stop charging the filter when receiving the second control signal. So that a better voltage may be provided to the PLL to shorten the locking time of the PLL.

15 Claims, 6 Drawing Sheets

PHASE LOCKED LOOP AND METHOD FOR CHARGING PHASE LOCKED LOOP

CROSS-REFERENCE TO RELATED APPLICATIONS

This application claims priority to Chinese Patent Application No. 200910081492.0, filed on Apr. 9, 2009, which is hereby incorporated by reference in its entirety.

FIELD OF THE INVENTION

The present invention relates to a phase locked loop technology, and in particular, to a phase locked loop and a method for charging the phase locked loop.

BACKGROUND

To achieve better noise performance, the filter of a phase locked loop (PLL) is generally composed of passive components. In low-bandwidth applications, the passive filter has a larger capacitance, so that it takes a long time for the PLL to implement the locking. To comply with the system locking time requirement and retain the low-bandwidth of the PLL, the general practice is adding a fast locking circuit to stabilize the PLL in the shortest time.

FIG. 1 illustrates a general PLL with the fast locking circuit in the prior art. To add a fast locking circuit, a P-type field effect transistor 102 (marked as MP1) is connected to the filter 101 of the PLL. The grid electrode of the MP1 must be connected to a control signal (marked as input in FIG. 1). When the PLL begins to work, the input is low level, and the MP1 is open. As shown in FIG. 1, the size of the MP1 is generally large. The purpose is to ensure that the MP1 can supply sufficient current to the capacitor of the filter 101 when the MP1 is open. The VCTRL voltage in the loop is unknown at the beginning because the residual charge on the capacitor of the filter 101 is unknown (perhaps the residual charge is 0 V or a fixed value). After the MP1 is open, the VCTRL voltage increases when the capacitor of the filter 101 is charged continuously. The MP1 is disconnected at a certain point of time when the input signal changes from low level to high level. In this case, the charging process is completed, and the VCTRL voltage on the filter 101 is a fixed value. Then, the PLL starts a formal locking process by using its negative feedback principle.

After analyzing the prior art, the inventor of the present invention discovers the following weaknesses of the fast locking circuit of the PLL in the prior art:

Because the VCTRL voltage on the filter cannot be determined in advance for the completion of charging, the fast locking circuit in the prior art cannot provide the PLL with a better VCTRL voltage to minimize the locking time of the PLL.

SUMMARY

Embodiments of the present invention provide a phase locked loop (PLL) and a method for charging the PLL to shorten the locking time of the PLL.

A phase locked loop (PLL) provided in an embodiment of the present invention includes a phase detector (PD), a filter, a voltage-controlled oscillator (VCO), and a frequency divider that are electrically connected in turn, wherein the two input ports of the PD are respectively connected to a reference frequency signal and a frequency division signal from an output port of the frequency divider; a signal from the PD is converted to a voltage signal after the signal passes through the filter and is inputted to the VCO; a clock signal generated by the VCO is sent to the frequency divider to obtain the frequency division signal. the PLL further comprising a charge circuit to charge the filter by sending a capacitor voltage to the filter, wherein the charge circuit comprises: a threshold judging module, configured to output a valid signal to a receiving module, when the capacitor voltage reaches a preset threshold; the receiving module, configured to receive a trigger signal and output a first control signal to a charging module according to the trigger signal and output a second control signal to the charging module when the receiving module received the valid signal; and the charging module, configured to charge the filter when received the first control signal and stop charging the filter when received the second control signal.

A method for charging a PLL in an embodiment of the present invention includes:

receiving a trigger signal;

charging a filter of the PLL according to the received trigger signal; and stopping charging when the voltage of the filter reaches a preset threshold.

In the embodiments of the present invention, a voltage threshold may be preset for the completion of the filter charging, so that a better voltage may be provided for the PLL to minimize the locking time of the PLL.

BRIEF DESCRIPTION OF THE DRAWINGS

For better description of the embodiments of the present invention or technical solution in the prior art, the following describes the required drawings. It is apparent that these drawings illustrate some embodiments of the present invention only, and those skilled in the art may obtain other drawings based on these drawings without creative work.

DETAILED DESCRIPTION OF EMBODIMENTS

The following describes the technical solution and exemplary embodiments of the present invention in detail with reference to the accompanying drawings. These embodiments are some embodiments of the present invention. Other embodiments that those skilled in the art obtain based on embodiments of the present invention without creative work fall into the scope of protection of the present invention.

Figure 1:
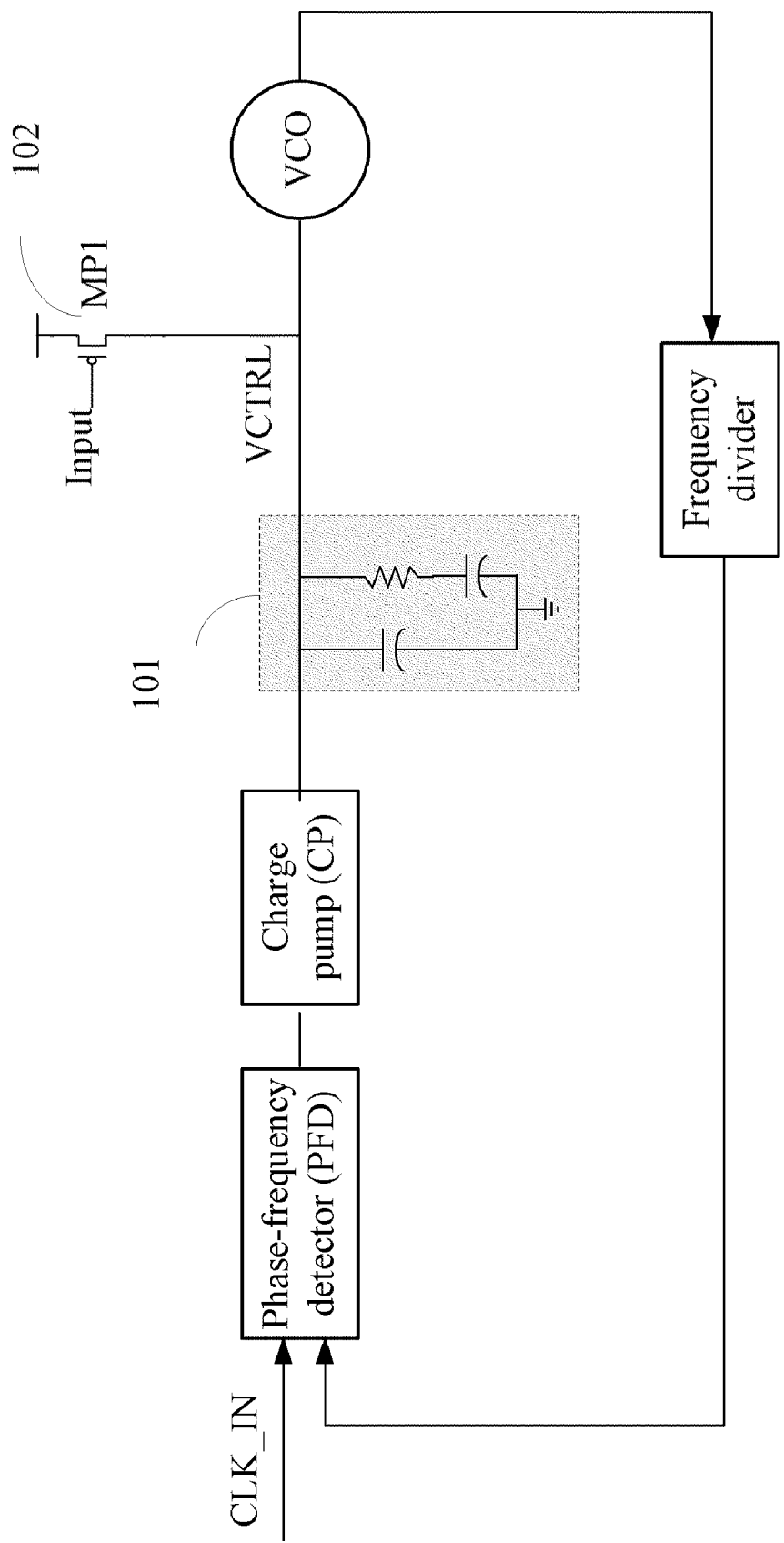
FIG. 1 illustrates a PLL with a charge circuit in the prior art.
Figure 2:
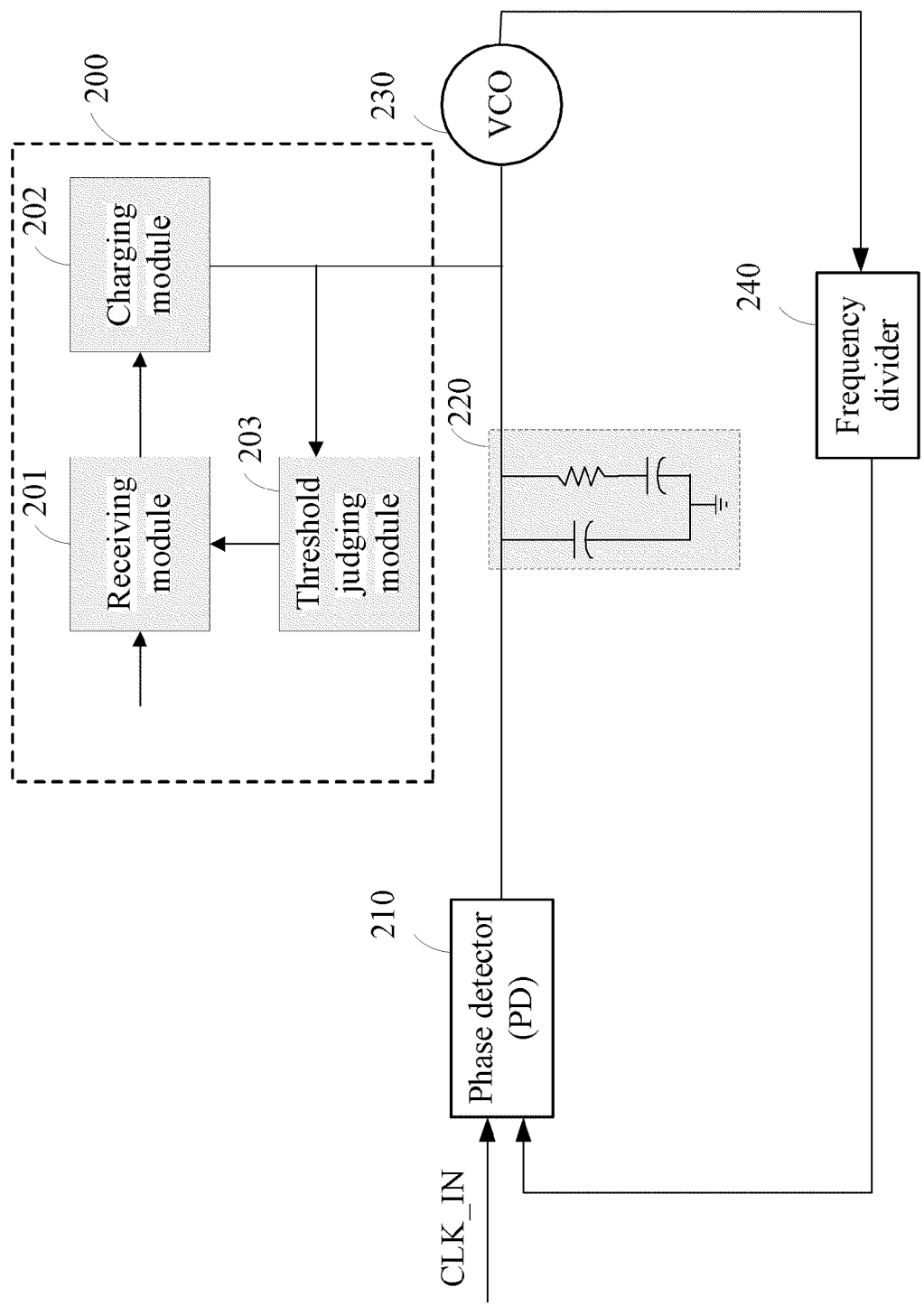
FIG. 2 is a schematic diagram illustrating a PLL in an embodiment of the present invention.

The first embodiment of the present invention provides a phase locked loop (PLL). FIG. 2 is a schematic diagram illustrating a PLL. The PLL includes a phase detector (PD) 210, a filter 220, an oscillator 230, and a frequency divider 240 that are electrically connected in turn. The two input ports of the PD 210 are separately connected to a reference frequency signal CLK_IN and a frequency division signal from the output port of the frequency divider. After detecting the phases of the reference frequency signal and the frequency division signal from the output port of the frequency divider, the PD 210 outputs these signals to the filter 220 for filtering; the signals that are filtered are input to the input port of the oscillator 230 through the output port of the filter 220 to make the oscillator 230 to output an oscillation signal; after the frequency divider 240 performs frequency division on the oscillation signal, the oscillation signal becomes a frequency division signal from the output port of the frequency divider. The input port of the oscillator 230 is also connected to a charge circuit 200, through which the filter 220 is charged to shorten the locking time of the PLL.

In this embodiment, the charge circuit 200 includes a receiving module 201, a charging module 202, and a threshold judging module 203. The input port of the receiving module 201 receives a trigger signal; the reset port of the receiving module 201 receives a signal from the threshold judging module 203. When the signal from the threshold judging module 203 is a valid signal, the output port of the receiving module 201 is reset, and outputs a second control signal to the charging module 202 to complete charging the filter. The output port of the receiving module 201 outputs a first control signal to the charging module 202 according to the trigger signal to make the output port of the charging module 202 to charge the filter 220. The output port of the charging module 202 is also electrically connected to the input port of the threshold judging module 203, and inputs a capacitor voltage to the threshold judging module 203. The threshold judging module 203 judges whether to stop charging the filter 220 according to the capacitor voltage threshold preset in the threshold judging module 203; if so, the threshold judging module 203 outputs a valid signal to the reset port of the receiving module 201. The reset port of the receiving module judges whether the received trigger signal is valid. If the received trigger signal is valid, the receiving module 201 makes the charging module 202 to stop charging the filter 220.

In this embodiment, by setting a preferred charge threshold in advance in the threshold judging module, a better voltage may be provided to the PLL to shorten the locking time of the PLL. This helps to overcome the weakness of long locking time of the PLL due to the uncertainty of the voltage on the filter after completion of charging.

Figure 3:
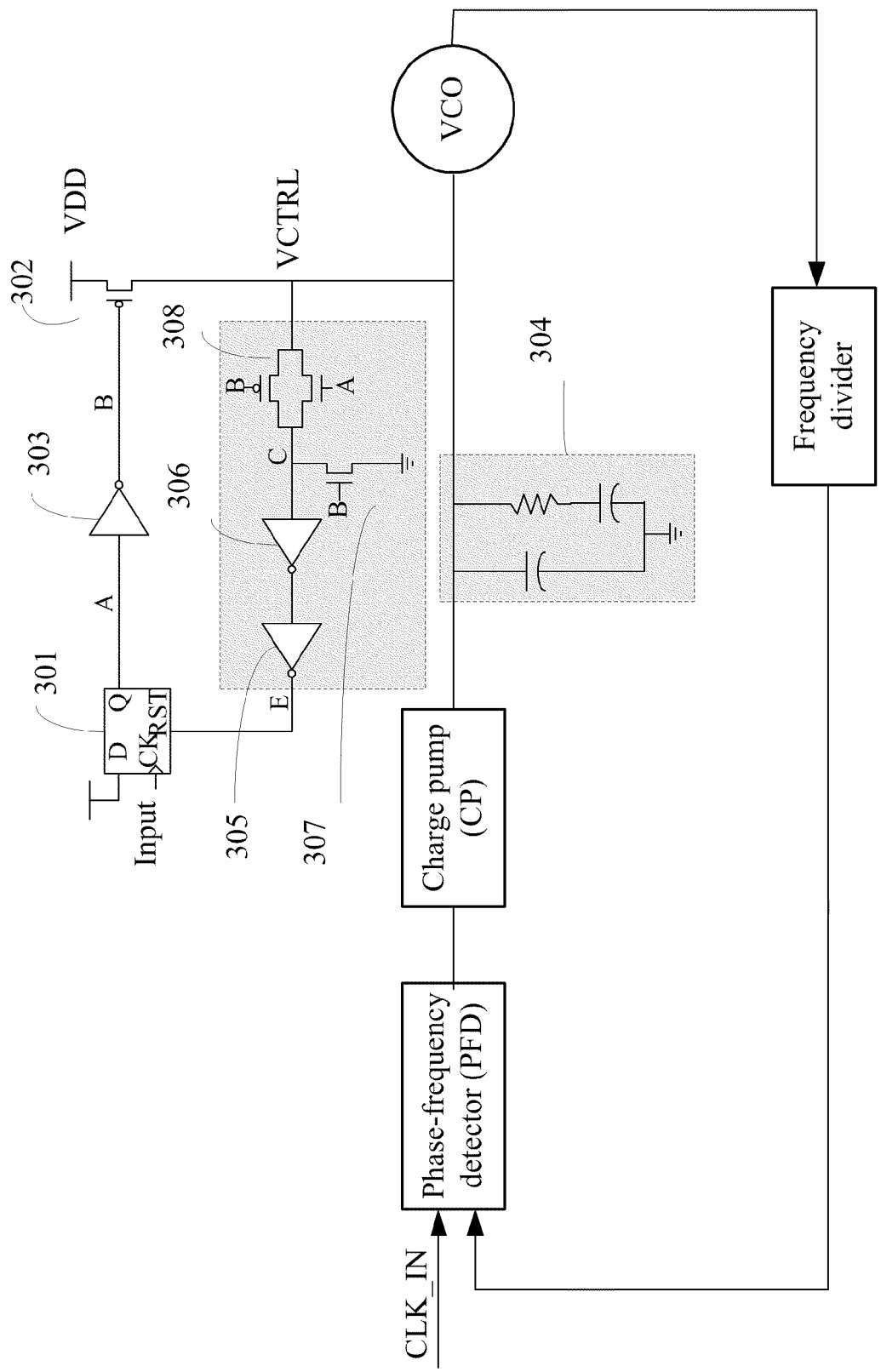
FIG. 3 is a schematic diagram illustrating a first PLL in an embodiment of the present invention.

In this embodiment, the PD 210 may also be a phase-frequency detector (PFD), as shown in FIG. 3. As shown in FIG. 3, the receiving module includes a D trigger 301, and the charging module 202 includes a field effect transistor 302. In this embodiment, the field effect transistor 302 is a P-type field effect transistor. The input port is connected to the clock-signal input port of the D trigger 301. The input port of the D trigger 301 is connected to the operating power supply VDD; the reset port RST of the D trigger 301 is connected to the threshold judging module; and the inverse phase output port $\overline{Q}$ of the D trigger 301 is connected to the charging module. In this embodiment, the output port Q of the D trigger 301 may also be connected to the charging module through an inverter 303. The reset port RST of the D trigger 301 is valid only in case of high level.

The source electrode of the field effect transistor 302 of the charging module is connected to the operating power supply VDD; the drain electrode of the field effect transistor 302 is connected to the input port of the threshold judging module; and the grid electrode of the field effect transistor 302 is connected to the inverse phase output port $\overline{Q}$ of the inverter 303 or to the output port of the D trigger 301 through the inverter 303. The drain electrode of the field effect transistor 302 is connected between the charge pump and the VCO of the PLL to charge the filter capacitor of the PLL.

The threshold judging module is adapted to set a capacitor voltage threshold to the filter 304 of the PLL in case of completion of charging. When the capacitor voltage of the filter 304 reaches the preset threshold, the charging is stopped. Multiple implementation modes are available to the threshold judging module. The implementation mode shown in FIG. 3 is one of these modes only. The threshold judging module in this embodiment includes a first inverter 305 and a second inverter 306 that are in serial connection, an N-type field effect transistor 307, and a transmission gate 308. The output port of the first inverter 305 is connected to the reset port of the D trigger 301. The input port of the second inverter 306 is connected to the drain electrode of the N-type field effect transistor 307 and one port of the transmission gate 308. The other port of the transmission gate 308 is connected to the drain electrode of the field effect transistor 302. The transmission gate 308 in this embodiment consists of a P-type field effect transistor and an N-type field effect transistor.

Assume that the input of the clock-signal input port of the D trigger 301 is a low level signal and the level of the output port Q of the D trigger 301 is low, where the level of the output port Q is be set to low level by means, for example, through the reset port RST). That is, the potential of point A is low level, the level of point B is changed to high level after passing through the inverter 303. Thus, the field effect transistor 302 is closed. For the N-type field effect transistor 307, the input potential of the grid electrode is the level of point B, that is, high level, and the source electrode is grounded. In this case, the N-type field effect transistor 307 is connected, and the potential of the drain electrode is low level, that is, the level of point C is low. For the transmission gate 308, because the potential of the grid electrode of the P-type field effect transistor is high but the potential of the N-type field effect transistor is low, the transmission gate 308 is closed. In conclusion, because both the field effect transistor 302 and the transmission gate 308 are closed, the VCTRL node is suspended. For the filter 304, because one port of the capacitor is grounded and the VCTRL is suspended, the capacitor of the filter 304 may not be charged. In addition, the potential of point C is low level, and after passing through the first inverter 305 and the second inverter 306, the potential of point E is still low level. That is, the input of the reset port RST (valid in case of high level) of the D trigger 301 is low level. Thus, the D trigger 301 may not reset the output port Q, so that the output of the port Q remains high level.

Assume that the input of the clock-signal input port of the D trigger 301 has an incoming rising edge level at t1, the output port Q may be inversed to high level because the input port of the D trigger 301 is connected to high level, that is, the operating power supply VDD). That is, the potential of point A is high level. After passing through the inverter 303, the level of point B is changed to low level. Thus, the field effect transistor 302 is connected. Because the drain electrode of the field effect transistor 302 is grounded through the capacitor of the filter 304, the operating power supply VDD may charge the capacitor of the LC filter 304 through the field effect transistor 302 after the field effect transistor 302 is connected. For the transmission gate 308, because the potential of the grid electrode of the P-type field effect transistor is low but the potential of the N-type field effect transistor is high, the transmission gate 308 is connected. For the N-type field effect transistor 307, the input potential B of the grid electrode is low level and the source electrode is grounded. Thus, the N-type field effect transistor 307 is closed.

When the charging proceeds, the potential of the upper plate (that is, a plate not grounded in FIG. 3) on the capacitor of the filter increases gradually. That is, the VCTRL potential increases gradually. After passing through the transmission gate 308, the potential of point C also increases gradually. After the potential of point C increases to a trigger threshold of the second inverter 306, the output of the second inverter is changed to low level, and the output E of the first inverter 305 is changed to high level. In this way, the reset port RST of the D trigger 301 is valid, and the output Q of the D trigger 301 is inversed to low level. Thus, the level of point A is high and the level of point B is low. As a result, the field effect transistor 302 and the transmission gate 308 are closed, and the N-type field effect transistor 307 is connected. Finally, the potential C of the drain electrode of the N-type field effect transistor 307 is changed to low level. Then, point E is changed to low level, and the reset port RST of the D trigger 301 is disabled. Because the field effect transistor 302 and the transmission gate 308 are closed, the VCTRL node is suspended. Then, the charging of the capacitor on the filter 304 is completed.

In this embodiment, the VCTRL voltage for the completion of charging may be set by properly setting the trigger thresholds of the first inverter 305 and the second inverter. In this embodiment, the first inverter 305 and the second inverter 306 have the same operating parameter and trigger threshold. Both the first inverter 305 and the second inverter 306 are formed by the P-type field effect transistor and the N-type field effect transistor that are in serial connection. In this embodiment, the trigger threshold of the first inverter 305 and the second inverter 306 is designed to be 0.8 V.

Figure 4:
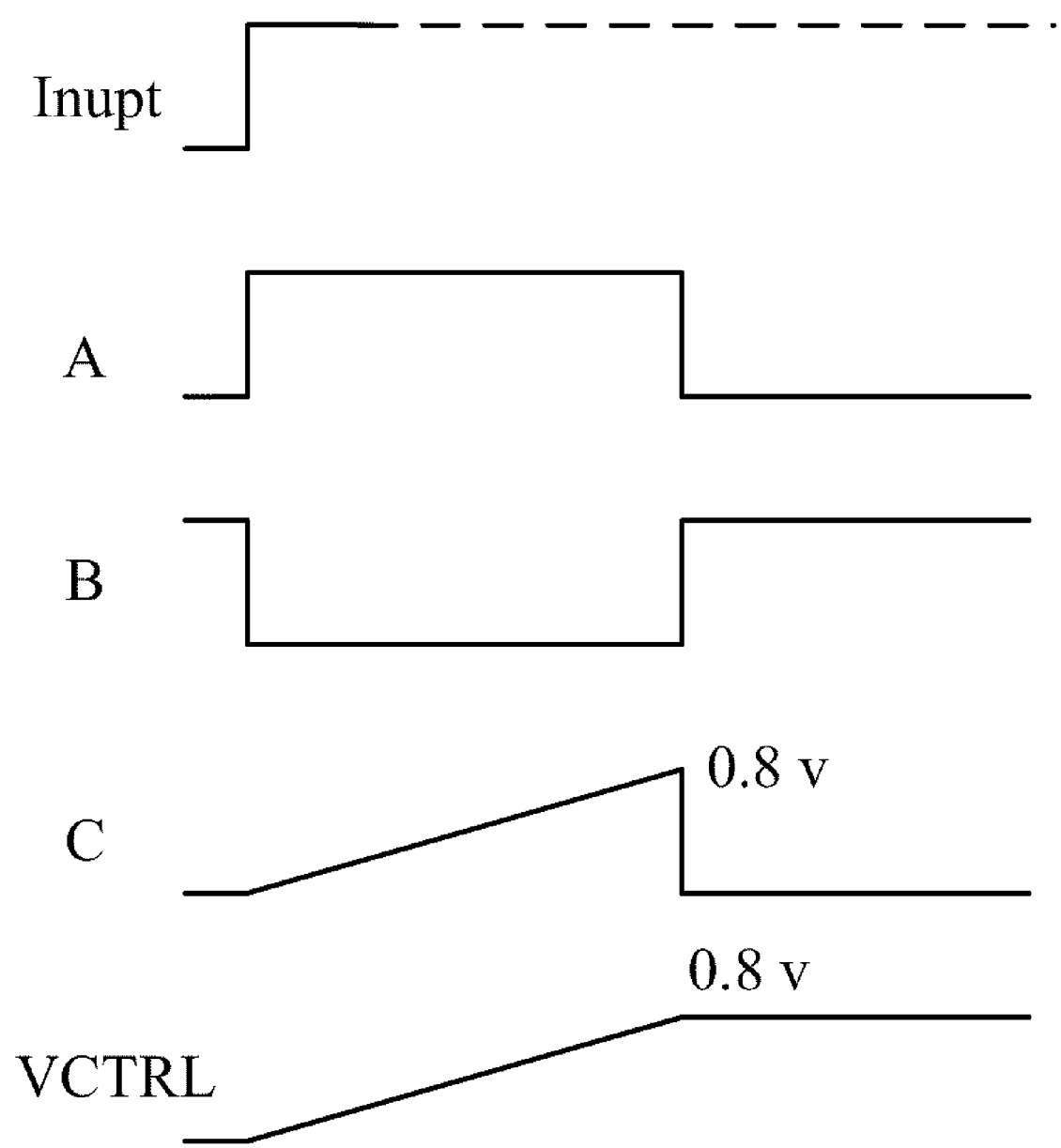
FIG. 4 is a schematic diagram illustrating waveforms of a PLL and nodes of a charge circuit in the PLL in an embodiment of the present invention.

In the preceding process, the waveforms of nodes such as input, A, B, C and VCTRL are shown in FIG. 4.

Figure 5:
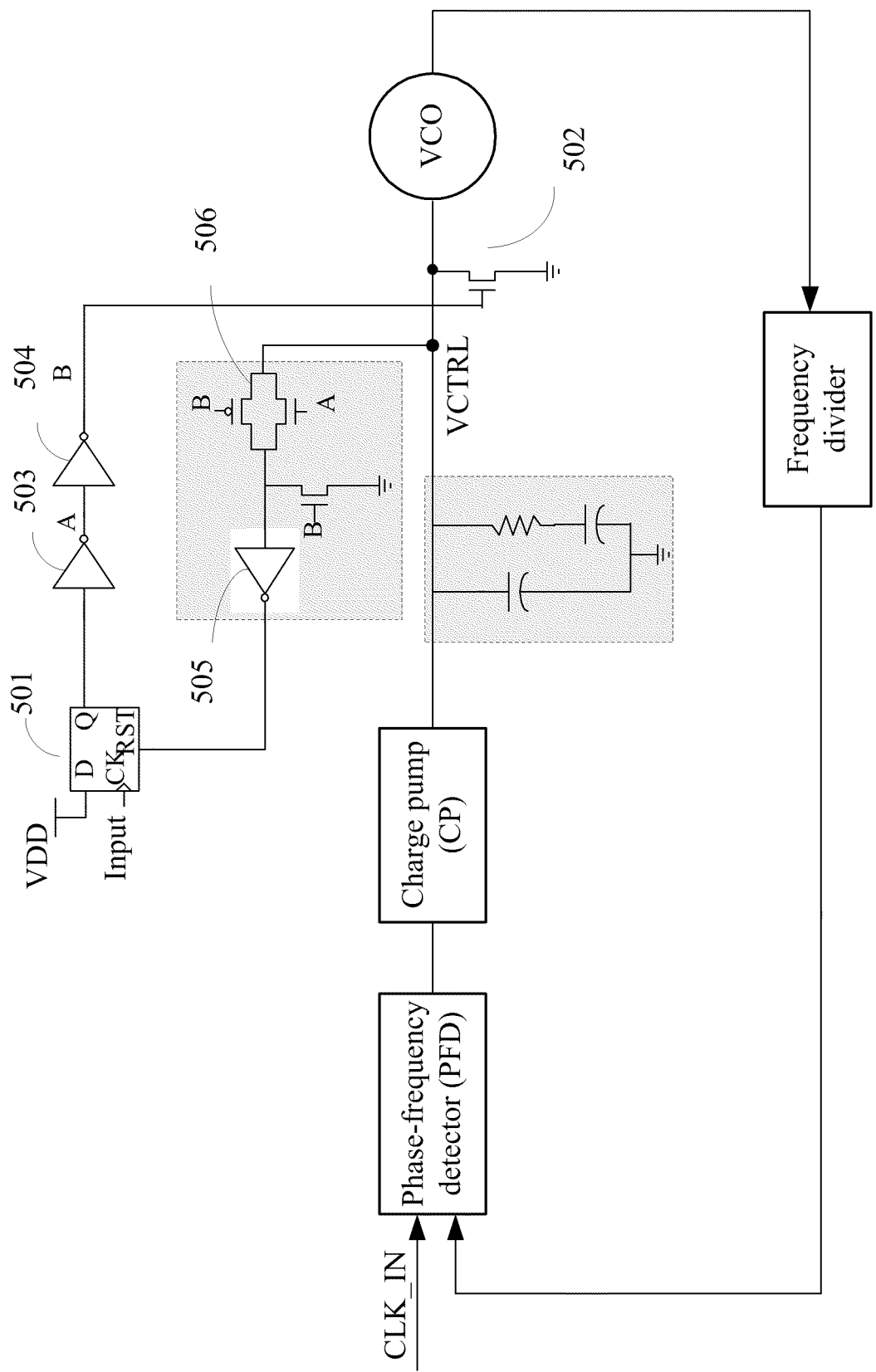
FIG. 5 is a schematic diagram illustrating another PLL in an embodiment of the present invention.

It should be noted that the field effect transistor of the charging module in this embodiment may also be an N-type field effect transistor. FIG. 5 shows the PLL and its charge circuit. As shown in FIG. 5, the receiving module includes a D trigger 501. The input signal of the charge circuit is connected to the clock-signal input port of the D trigger 501. The input port of the D trigger 501 is connected to the operating power supply; the output port of the D trigger 501 is connected to the charging module; and the reset port of the D trigger 501 is connected to the threshold judging module. The charging module includes a first N-type field effect transistor 502. The source electrode of the first N-type field effect transistor 502 is grounded; the grid electrode of the first N-type field effect transistor 502 is connected to the output port of the D trigger 501; and the drain electrode of the first N-type field effect transistor 502 is connected to the input port of the threshold judging module. The drain electrode of the first N-type field effect transistor 502 is also connected between the charge pump and the VCO of the PLL to charge the filter capacitor of the PLL. The threshold judging module includes an inverter 505. The output port of the inverter 505 is connected to the reset port RST of the D trigger, and the input port of the inverter 505 is connected to the drain electrode of the second N-type field effect transistor 506 and to one port of the transmission gate. The other port of the transmission 507 is connected to the drain electrode of the first N-type field effect transistor 502.

When the field effect transistor of the charging module is an N-type field effect transistor, the D trigger 501 is connected to the grid electrode of the first N-type field effect transistor 502 through the inverter 503 and the inverter 504. In addition, the source electrode of the first N-type field effect transistor 502 is grounded. The operating principle of FIG. 5 is similar to the operating principle of FIG. 3. There is the following difference between them: In FIG. 5, when the VCTRL is smaller than the trigger threshold of the threshold judging module, the first N-type field effect transistor 502 in the loop is closed through feedback. The N-type field effect transistor is generally used as the field effect transistor of the charging module when a low VCTRL voltage is required in the loop.

In this embodiment, the charging module may not use the field effect transistor. Instead, the charging module may use a semiconductor that can charge the filter capacitor, for example, a circuit with a transistor.

In the prior art, the control signal (that is, input) in the charge circuit must be a level signal. In addition, the level signal duration must be accurately determined during the circuit design. When the circuit process is changed, it is difficult to determine the preceding duration. In embodiments of the present invention, an edge trigger signal instead of the level signal may be used, and the level signal duration does not need to be designed in advance. In this way, the problem that the level duration must be accurately determined at the time of design in the prior art is solved. The final stable voltage of the filter may also be preset by the threshold judging module, and thus solving the problem that the voltage of the filter capacitor is not determined after completion of charging in the prior art. After the charging process is complete, the charge circuit of the PLL in embodiments of the present invention may be automatically disconnected, without disturbing the normal operation of the PLL. This helps to overcome the weakness of long locking time of the PLL due to the uncertainty of the voltage on the filter in case of completion of charging.

Figure 6:
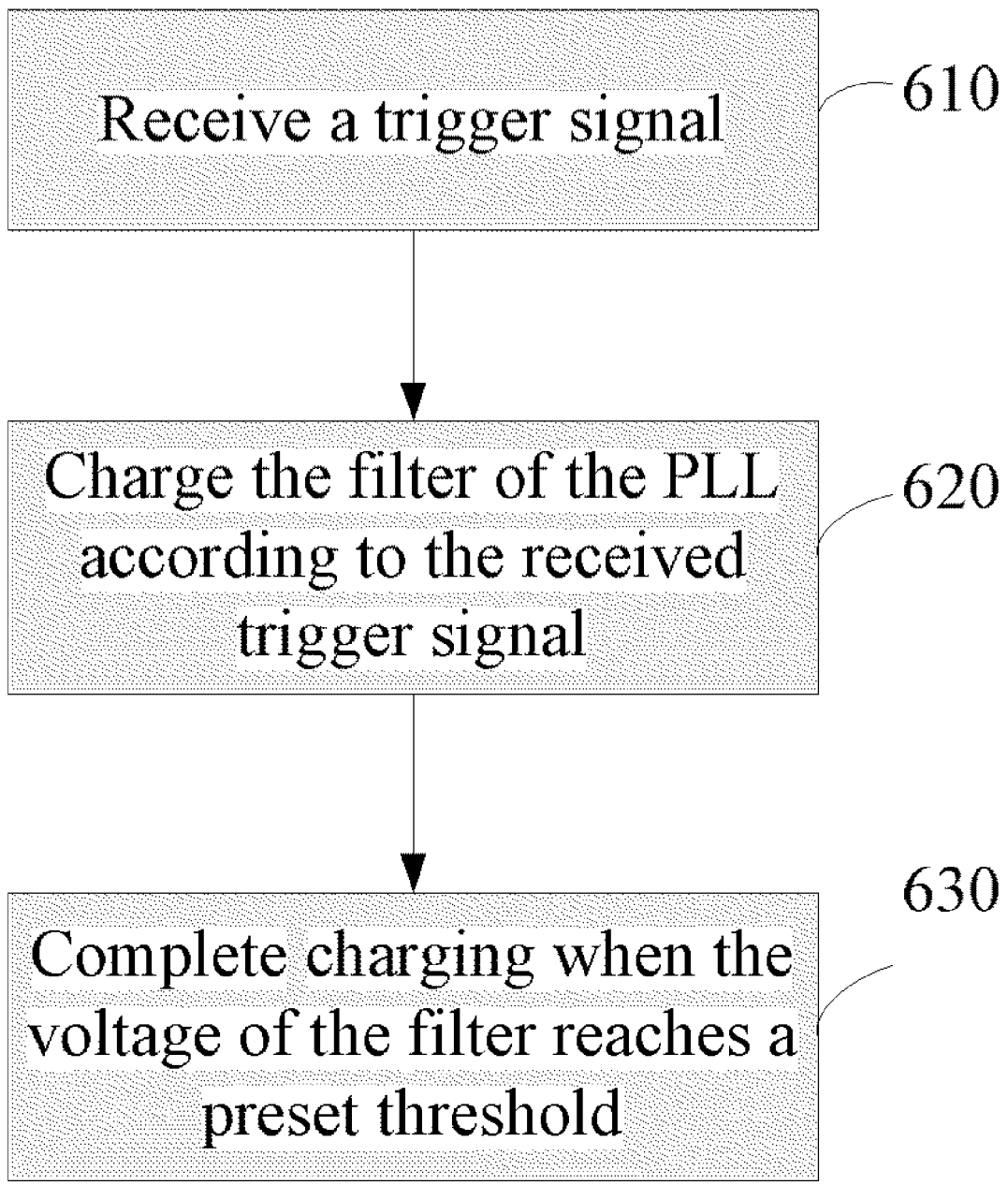
FIG. 6 is a flowchart of a method for charging a PLL in an embodiment of the present invention.

The third embodiment of the present invention provides a method for charging the PLL. As shown in FIG. 6, the method includes the following steps:

Step 610: Receive a trigger signal.

Step 620: Charge the filter of the PLL according to the trigger signal.

Step 630: Complete charging when the capacitor voltage of the filter reaches the preset threshold.

Further, the preceding trigger signal may be an edge trigger signal.

Specifically, as shown in FIG. 3, receiving the edge trigger signal in step 610 includes:

Setting the D trigger 301; inputting the input signal to the clock-signal input port CK of the D trigger 301; inputting the operating power supply VDD to the input port Q of the D trigger 301; outputting a high level voltage from a output Q of the D trigger 301 when the input of the clock-signal input port of the D trigger 301 has an incoming rising edge level. Assume that the input of the clock-signal input port of the D trigger 301 has an incoming rising edge level at t1, the output port Q may be inversed to high level because the input port of the D trigger 301 is connected to high level (the operating power supply VDD), that is, the potential of point A is high level.

Charging the filter of the PLL according to the received trigger signal in step 620 includes:

(1) Set the P-type field effect transistor 302.

(2) Connect the source electrode of the P-type field effect transistor 302 to the operating power supply VDD, the grid electrode of the P-type field effect transistor 302 to the inverse phase output port of the D trigger 301, and the drain electrode of the P-type field effect transistor 302 between the charge pump and the VCO of the PLL to charge the capacitor of the filter 304 of the PLL.

After passing through the inverter 303, the level of point B is changed to low level. Thus, the field effect transistor 302 is connected. Because the drain electrode of the P-type field effect transistor 302 is grounded through the capacitor of the filter 304, the operating power supply VDD may charge the capacitor of the filter 304 through the P-type field effect transistor 302 after the field effect transistor 302 is connected. For the transmission gate 308, because the potential of the grid electrode of the P-type field effect transistor is low but the potential of the N-type field effect transistor is high, the transmission gate 308 is connected. For the N-type field effect transistor 307, the input potential B of the grid electrode is low level and the source electrode is grounded. Thus, the N-type field effect transistor 307 is closed.

Stopping charging when the voltage of the filter reaches the preset threshold in step 630 includes:

(1) Setting the N-type field effect transistor 307, the transmission gate 308, and the first inverter 305 and the second inverter 306 that are in serial connection.

(2) Connecting the output port of the first inverter 305 to the reset port of the D trigger 301, and the input port of the second inverter 306 to the drain electrode of the N-type field effect transistor 307 and one port of the transmission gate 308; and connect the other port of the transmission gate 308 to the drain electrode of the P-type field effect transistor 302, where the reset port of the D trigger 301 is valid in case of high level.

When the charging of the filter 304 proceeds, the potential of the upper plate (that is, a plate not grounded in FIG. 3) on the capacitor of the filter 304 increases gradually. That is, the VCTRL potential increases gradually. After passing through the transmission gate 308, the potential of point C also increases gradually. After the potential of point C increases to the trigger threshold of the second inverter 306, the output of the second inverter 306 is changed to low level, and the output E of the first inverter 305 is changed to high level. Thus, the reset port RST of the D trigger 301 is valid, and the output Q of the D trigger 301 is inversed to low level. Thus, the level of point A is high and the level of point B is low. As a result, the P-type field effect transistor 302 and the transmission gate 308 are closed, and the N-type field effect transistor 307 is connected. Finally, the potential C of the drain electrode of the N-type field effect transistor 307 is changed to low level. Then, point E is changed to low level, and the port RST of the D trigger 301 is disabled. Because the P-type field effect transistor 302 and the transmission gate 308 are closed, the VCTRL node is suspended. Then, the charging of the capacitor on the filter 304 is complete.

As shown in FIG. 5, receiving the edge trigger signal in step 610 may also include:

(1) Set the first N-type field effect transistor 502.

(2) Connect the source electrode of the first N-type field effect transistor 502 to the ground, the grid electrode of the first N-type field effect transistor 502 to the output port of the D trigger 501, and the drain electrode of the first N-type field effect transistor 502 between the charge pump and the VCO of the PLL to charge the filter capacitor of the PLL.

Stopping charging when the voltage of the filter reaches the preset threshold in step 630 includes:

(1) Set the second N-type field effect transistor 507, the transmission gate 506 and the inverter 505.

(2) Connect the output port of the inverter 505 to the reset port of the D trigger 501, and the input port of the inverter 505 to the drain electrode of the second N-type field effect transistor 507 and one port of the transmission gate 506; and connect the other port of the transmission gate 308 to the drain electrode of the first N-type field effect transistor 502, where the reset port of the D trigger is valid in case of high level.

When the field effect transistor of the charging module is an N-type field effect transistor, the D trigger 501 is connected to the grid electrode of the first N-type field effect transistor 502 through the inverter 503 and the inverter 504. In addition, the source electrode of the first N-type field effect transistor 502 is grounded. The operating principle of FIG. 5 is similar to that of FIG. 3. There is the following difference between them: In FIG. 5, when the VCTRL is smaller than the trigger threshold of the threshold judging module, the first N-type field effect transistor 502 in the loop is closed through feedback. The N-type field effect transistor is generally used as the field effect transistor of the charging module when a low VCTRL voltage is required in the loop.

In step 620 in this embodiment, the charging module may not use the field effect transistor. Instead, the charging module may use a semiconductor that can charge the filter capacitor, for example, a circuit with a transistor.

In the prior art, the control signal (that is, input) in the charge circuit must be a level signal. In addition, the level signal duration must be accurately determined during the circuit design. When the circuit process is changed, it is difficult to determine the preceding duration. According to the method provided in embodiments of the present invention, an edge trigger signal instead of the level signal may be used, and the level signal duration does not need to be designed in advance, thus solving the problem that that the level duration must be accurately determined at the time of design in the prior art. The final stable voltage of the filter may also be preset in step 630, thus solving the problem that the voltage on the filter capacitor is not determined in case of completion of charging in the prior art. After the charging process is complete, the method provided in embodiments of the present invention may automatically complete charging the filter of the PLL, without disturbing the normal operation of the PLL.

Although the invention has been described through some exemplary embodiments, the invention is not limited to such embodiments. It is apparent that those skilled in the art can make various modifications and variations to the invention without departing from the scope of the invention. The invention is intended to cover the modifications and variations provided that they fall in the scope of protection defined by the following claims or their equivalents.

What is claimed is:

1. A phase locked loop (PLL), comprising a phase detector (PD), a filter, a voltage-controlled oscillator (VCO), and a frequency divider that are electrically connected in turn, wherein two input ports of the PD are respectively connected to a reference frequency signal and a frequency division signal from an output port of the frequency divider; a signal from the PD is converted to a voltage signal after the signal passes through the filter and is inputted to the VCO; a clock signal generated by the VCO is sent to the frequency divider to obtain the frequency division signal;

the PLL further comprising a charge circuit to charge the filter by sending a capacitor voltage to the filter, wherein the charge circuit comprises:

a threshold judging module, configured to output a valid signal to a receiving module, when the capacitor voltage reaches a preset threshold;

the receiving module, configured to receive a trigger signal and output a first control signal to a charging module according to the trigger signal and output a second control signal to the charging module when the receiving module receives the valid signal; and the charging module, configured to charge the filter when the first control signal is received and stop charging the filter when the second control signal is received.

2. The PLL of claim 1, wherein the trigger signal is an edge trigger signal.

3. The PLL of claim 2, wherein the receiving module comprises a D trigger, a clock-signal input port of the D trigger configured to receive the edge trigger signal;

a data input port of the D trigger connected to an operating power supply;

an inverse phase output port of the D trigger connected to the charging module; and a reset input port of the D trigger configured to receive the valid signal from the threshold judging module.

4. The PLL of claim 3, wherein the charging module comprises a P-type field effect transistor,
a source electrode of the P-type field effect transistor connected to the operating power supply;
a grid electrode of the P-type field effect transistor connected to the inverse phase output port of the D trigger;
a drain electrode of the P-type field effect transistor connected to an input port of the threshold judging module to send the capacitor voltage to the threshold judging module and connected the filter to charge the filter.

5. The PLL of claim 4, wherein the threshold judging module comprises a first inverter, a second inverter, an N-type field effect transistor, and a transmission gate,
an input port of the transmission gate connected to the drain electrode of the P-type field effect transistor;
an output port of the transmission gate connected to an input port of the second inverter and a drain electrode of the N-type field effect transistor;
an output port of the second inverter connected to an input port of the first inverter; and
an output port of the first inverter is connected to the reset input port of the D trigger, wherein the reset input port of the D trigger is valid in case of high level voltage.

6. The PLL of claim 2, wherein the receiving module comprises a D trigger,
a clock-signal input port of the D trigger configured to receive the edge trigger signal;
a data input port of the D trigger connected to an operating power supply;
an output port of the D trigger connected to the charging module; and
a reset input port of the D trigger connected to the threshold judging module.

7. The PLL of claim 6, wherein the charging module comprises a first N-type field effect transistor, wherein:
a source electrode of the first N-type field effect transistor is grounded; a grid electrode of the first N-type field effect transistor is connected to the output port of the D trigger; and a drain electrode of the first N-type field effect transistor is connected to an input port of the threshold judging module; and the drain electrode of the first N-type field effect transistor is also connected to the filter to charge the filter.

8. The PLL of claim 7, wherein the threshold judging module comprises an inverter, a second N-type field effect transistor, and a transmission gate, wherein:
an output port of the inverter is connected to the reset input port of the D trigger;
an input port of the inverter is connected to a drain electrode of the second N-type field effect transistor and an output port of the transmission gate; and
an input port of the transmission gate is connected to the drain electrode of the first N-type field effect transistor, wherein the reset input port of the D trigger is valid in case of high level.

9. A method for charging a phase locked loop (PLL), comprising:
receiving a trigger signal and outputting a first control signal to a charging module according to the trigger signal;
charging a filter of the PLL according to the trigger signal when the first control signal is received by the charging module;
outputting a valid signal to a receiving module when the voltage of the filter reaches a preset threshold;
outputting a second control signal to the charging module when the receiving module receives the valid signal; and
stopping charging the filter when the second control signal is received by the charging module.

10. The method of claim 9, wherein the trigger signal is an edge trigger signal and is received through a D trigger.

11. The method of claim 10, further comprising:
inputting an input signal to a clock-signal input port CK of the D trigger;
inputting an operating power supply VDD to an input port of the D trigger; and
outputting a high level voltage from an output Q of the D trigger when an input of the clock-signal input port of the D trigger has an incoming rising edge level.

12. The method of claim 11, wherein the step of charging the filter of the PLL according to the trigger signal further comprises:
setting a P-type field effect transistor; wherein a source electrode of the P-type field effect transistor is connected to an operating power supply, a grid electrode of the P-type field effect transistor is connected to an inverse phase output port of the D trigger, and a drain electrode of the P-type field effect transistor is connected to an input port of a voltage-controlled oscillator of the PLL; and
charging the filter of the PLL through the P-type field effect transistor.

13. A method for charging a phase locked loop (PLL), comprising:
receiving a trigger signal;
charging a filter of the PLL according to the trigger signal; and
stopping charging when the voltage of the filter reaches a preset threshold;
wherein the trigger signal is an edge trigger signal and is received through a D trigger and the method further comprises:
inputting an input signal to a clock-signal input port CK of the D trigger;
inputting an operating power supply VDD to an input port of the D trigger; and
outputting a high level voltage from an output Q of the D trigger when an input of the clock-signal input port of the D trigger has an incoming rising edge level.

14. The method of claim 13, wherein the step of charging the filter of the PLL according to the trigger signal further comprises:
setting a P-type field effect transistor; wherein a source electrode of the P-type field effect transistor is connected to an operating power supply, a grid electrode of the P-type field effect transistor is connected to an inverse phase output port of the D trigger, and a drain electrode of the P-type field effect transistor is connected to an input port of a voltage-controlled oscillator of the PLL; and
charging the filter of the PLL through the P-type field effect transistor.

15. The method of claim 13, wherein the step of stopping charging when the voltage of the filter reaches a preset threshold further comprises:
receiving a trigger signal and output a first control signal according to the trigger signal;
outputting a second control signal when a valid signal is received;
charging the filter when the first control signal is received and stop charging the filter when the second control signal is received.

* * * * *